(12) United States Patent
Deas et al.

(10) Patent No.: US 7,609,119 B2
(45) Date of Patent: Oct. 27, 2009

(54) REFERENCE VOLTAGE GENERATOR FOR LOGIC ELEMENTS PROVIDING STABLE AND PREDEFINED GATE PROPAGATION TIME

(76) Inventors: Alexander Roger Deas, King's Gate Lodge, Dalkeith, Edinburgh (GB) EH22 1ST; Igor Anatolievich Abrosimov, 12-82 Prospect Hoshi-Mina, St. Petersburg (RU) 194356

( * ) Notice: Subject to any disclaimer, the term of this patent is extended or adjusted under 35 U.S.C. 154(b) by 0 days.

(21) Appl. No.: 10/997,592

(22) Filed: Nov. 24, 2004

(65) Prior Publication Data
US 2005/0110583 A1    May 26, 2005

Related U.S. Application Data

(63) Continuation-in-part of application No. PCT/RU03/000241, filed on May 28, 2003.

(60) Provisional application No. 60/383,120, filed on May 28, 2002.

(51) Int. Cl.
*H03L 5/00* (2006.01)
(52) U.S. Cl. .................. 331/44; 331/15; 331/57; 331/74
(58) Field of Classification Search .............. 331/44, 331/57, 15, 74
See application file for complete search history.

(56) References Cited

U.S. PATENT DOCUMENTS

| | | | |
|---|---|---|---|
| 5,039,602 A | 8/1991 | Merrill et al. | |
| 5,331,295 A | 7/1994 | Jelinek et al. | |
| 5,747,978 A | 5/1998 | Gariboldi et al. | |
| 5,847,616 A | 12/1998 | Ng et al. | |
| 6,414,557 B1 * | 7/2002 | Liu | 331/57 |
| 6,566,970 B2 * | 5/2003 | Ingino, Jr. | 331/57 |
| 6,717,478 B1 * | 4/2004 | Kim et al. | 331/57 |
| 6,993,107 B2 * | 1/2006 | Cranford et al. | 375/376 |

FOREIGN PATENT DOCUMENTS

EP    1037388 A2    9/2000

OTHER PUBLICATIONS

International Search Report mailed Dec. 9, 2003 for PCT/RU03/00241.

* cited by examiner

*Primary Examiner*—Robert Pascal
*Assistant Examiner*—James E Goodley
(74) *Attorney, Agent, or Firm*—Schwabe, Williamson & Wyatt P.C.

(57) ABSTRACT

A reference voltage generator and a method for generating a reference voltage for a logic device using the reference voltage generator is provided. The voltage reference generator includes a ring oscillator having a plurality of logic gates and a phase/frequency detector. A first reference voltage is generated on the basis of a phase/frequency difference between the phase/frequency of a reference clock and the phase/frequency of the ring oscillator. A second reference voltage is generated on the basis of a voltage swing of the oscillator circuit. Both reference voltages can be applied to the plurality of logic gates of the ring oscillator such that a constant delay is created through each logic gate of the logic device.

17 Claims, 2 Drawing Sheets

REFERENCE VOLTAGE GENERATOR FOR LOGIC ELEMENTS PROVIDING STABLE AND PREDEFINED GATE PROPAGATION TIME

CROSS-REFERENCE TO RELATED APPLICATIONS

This application is a Continuation-in-Part of PCT/RU03/00241 of 28 May 2003 claiming priority from U.S. Provisional application 60/383,120 filed on 28 May 2002.

TECHNICAL FIELD

The present invention relates to a circuit for generating a reference voltage. In particular, the invention relates to generating a voltage reference that is a function of the gate propagation time, to create circuits where a constant time characteristic is beneficial.

BACKGROUND OF THE INVENTION

Voltage references are used widely in electronics to create a stable current or voltage. The voltage references are normally chosen either to be fixed, or to track temperature or process variations.

Most of the known circuits which generate a reference voltage use a structure of the bandgap type which is based on the principle of the thermal dependence of both the voltage drop across the base-emitter junction, VBE, and the thermal voltage VT (VT=k*T/q) of a bipolar transistor. These two voltage values have a negative and a positive thermal coefficient, respectively, i.e. they are respectively increased and decreased with the device temperature. Thus, by an appropriate weighted sum, it is possible to obtain from them a voltage generating circuit which has a null thermal coefficient, i.e. is unaffected by variations in temperature. The circuit of this type is disclosed in U.S. Pat. No. 5,747,978 for generating a reference voltage and detecting a drop in a supply voltage.

Another widely used approach is to implement a replica bias structure. According to U.S. Pat. No. 5,847,616, a replica biasing circuit producing the impedance control voltage immune to variations in the semiconductor manufacturing process, fluctuations in the power supply voltage source, and changes in operating temperature is provided for a voltage reference generator to produce a stable reference voltage that is coupled to the voltage reference input terminal of the replica biasing circuit.

The above approach is typically used also in differential current mode inverters/buffers such as shown in FIG. 2, to provide a predefined current through the MOSFET 1 and another one for the pull-ups. It can be used also to control of pull ups in single ended open drain logic and in totem pole logic, etc.

Whilst the present invention has wide application, for the sake of clarity, consider the case where a voltage reference is required in a differential current mode inverter/buffer as shown in FIG. 2.

This circuit in FIG. 2 has a voltage reference 22 to control the current in the MOSFET 21, and a further voltage reference 20 is required to control the voltage swing of a MOSFET for the pull up devices 25 and 26.

These voltage references are normally chosen either to be fixed, or to track temperature or process variations. Usually the voltage reference has the same structure as the transistor to be controlled, with constant logic levels, controlling the logic low voltage level based on the required swing. However, in this case, all variations in temperature, process technology and power supply cause variations in the propagation time of the gate.

Libraries of leaf cells used in the design of integrated circuits quote a range of propagation delays for each cell. At the same time, it is not usually of any advantage when the cell operates faster than the slowest case: circuits must be simulated using worst case figures.

BRIEF SUMMARY OF THE INVENTION

It is a primary object of the present invention to provide a voltage reference which is a function of gate propagation delay.

It is another primary object of the present invention to apply that voltage reference to translate variations in temperature, power supply voltage and process variation that would otherwise be wasted, into savings in power consumption.

It is another object of the present invention to provide a reference that can control circuits such that they have a constant propagation delay characteristic, or switching characteristics such as slew rate and bandwidth. Such gates can be used in high frequency filters, oscillators, drivers, verniers and in other applications.

A particular form of the invention is suitable for use with differential current mode circuits that normally have a high power consumption per stage (i.e., gate).

The present invention relates to use of a ring oscillator and phase detector to generate a signal, which is filtered to provide a voltage reference which varies as a function of the ring oscillator gate delays, which in turn vary with temperature, process variation and power supply voltages.

According to the invention, a reference voltage generator for generating a reference voltage for a logic device comprises a ring oscillator having a plurality of logic stage (i.e., gates) incorporating the said logic device, a reference clock generator; a means for detecting a phase or frequency difference between the reference clock and the ring oscillator, to generate a first feedback signal that causes the current of said plurality of logic gates to vary as a function of the period of the ring oscillator; and a means for measuring a voltage swing of the oscillator circuit, to generate a second feedback signal that causes the current of said plurality of logic gates to vary as a function of the amplitude variations in the ring oscillator; whereby a constant delay is created through each logic gate of the logic device.

In another aspect of the invention, a method of generating a reference voltage for a logic device by using the reference voltage generator as above and a logic device with a controlled propagation delay of each of the logic gates are provided.

BRIEF DESCRIPTION OF THE SEVERAL VIEWS OF THE DRAWINGS

For a better understanding of the present invention and the advantages thereof and to show how the same may be carried into effect, reference will now be made, by way of example, without loss of generality to the accompanying drawings in which.

DETAILED DESCRIPTION OF THE INVENTION

The invention will now be described in detail without limitation to the generality of the present invention with the aid of example embodiments and accompanying drawings.

Figure 1:
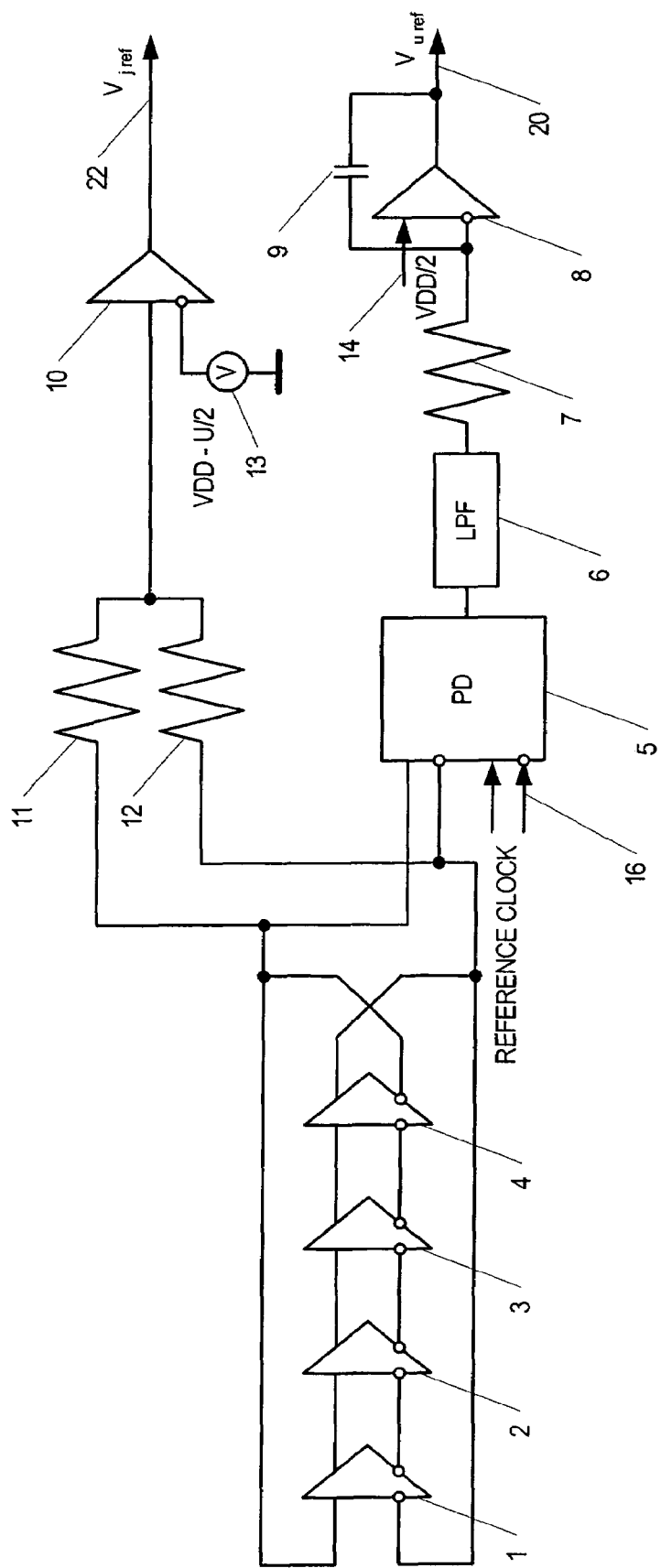
FIG. 1 shows a block diagram of one of the embodiments of the present invention.

FIG. 1 shows a block diagram of an example embodiment of the reference voltage generator according to the present invention. The reference voltage generator comprises a ring oscillator 1 to 4, which incorporates as its logic stage (i.e., gate), the logic device, to which the reference voltage generated by said reference voltage generator is applied.

Further, the reference voltage generator shown in FIG. 1 comprises a phase/frequency detector 5, amplifier 10, summing resistors 11, 12, low pass filter 6, an integrator consisting of resistor 7, amplifier 8 and capacitor 9, with voltage sources 13,14, and a reference clock 16.

The reference clock 16, can be generated with very high accuracy and stability, for example using a signal derived from a crystal oscillator. The reference clock shall be defined first, to define the number of gates needed in the ring oscillator 1,2,3,4. The period of the ring oscillator 1-4 should be the same as the period of the reference clock 16 for the slowest conditions of temperature, power supply and process. In general case, the number of stages (i.e., gates) can be defined, thus, by dividing the half period of the reference clock by the delay of each logic gate. If the ratio of frequencies is too large, a divider can be placed between the ring oscillator 1-4 and the phase detector 5 as is normal practice in phase locked clock synthesisers.

The phase detector 5, converts the phases of the reference clock 16 and the phase of the ring oscillator 1-4 into an error signal, expressed as a pulse width modulated signal. In the simplest case the phase detector 5 can be implemented using an XOR gate. The low pass filter 6, converts this signal into a voltage, which is then integrated to provide a voltage reference 20, for controlling pull up strength.

It is appreciated that within the present application, the term "phase detector" incorporates a phase detector or a phase/frequency detector. The voltage swing of the oscillation in the ring oscillator 1, 2, 3, 4, assuming the highest voltage is Vdd, is measured using equal summing resistors 11 and 12, which is compared with a voltage source 13, which is set to (Vdd−half of the required amplitude). This difference is amplified by amplifier 10, which is then applied as the second feedback signal to the gates in the ring oscillator to control their current, in the case they are controlled by current sources, such as 21 in the pull down structure in differential current mode gates.

In the prior art clock synthesisers, the frequency of the ring oscillators are controlled through current of the pull down structure for the differential stage (i.e., gate). The propagation delay is relatively insensitive to the pull down current.

The reference voltage 20, as applied to the pull up devices, acts directly because it changes the product of the pull up resistance and parasitic capacitance of the gate, and the input parasitic capacitance of the load.

Figure 2:
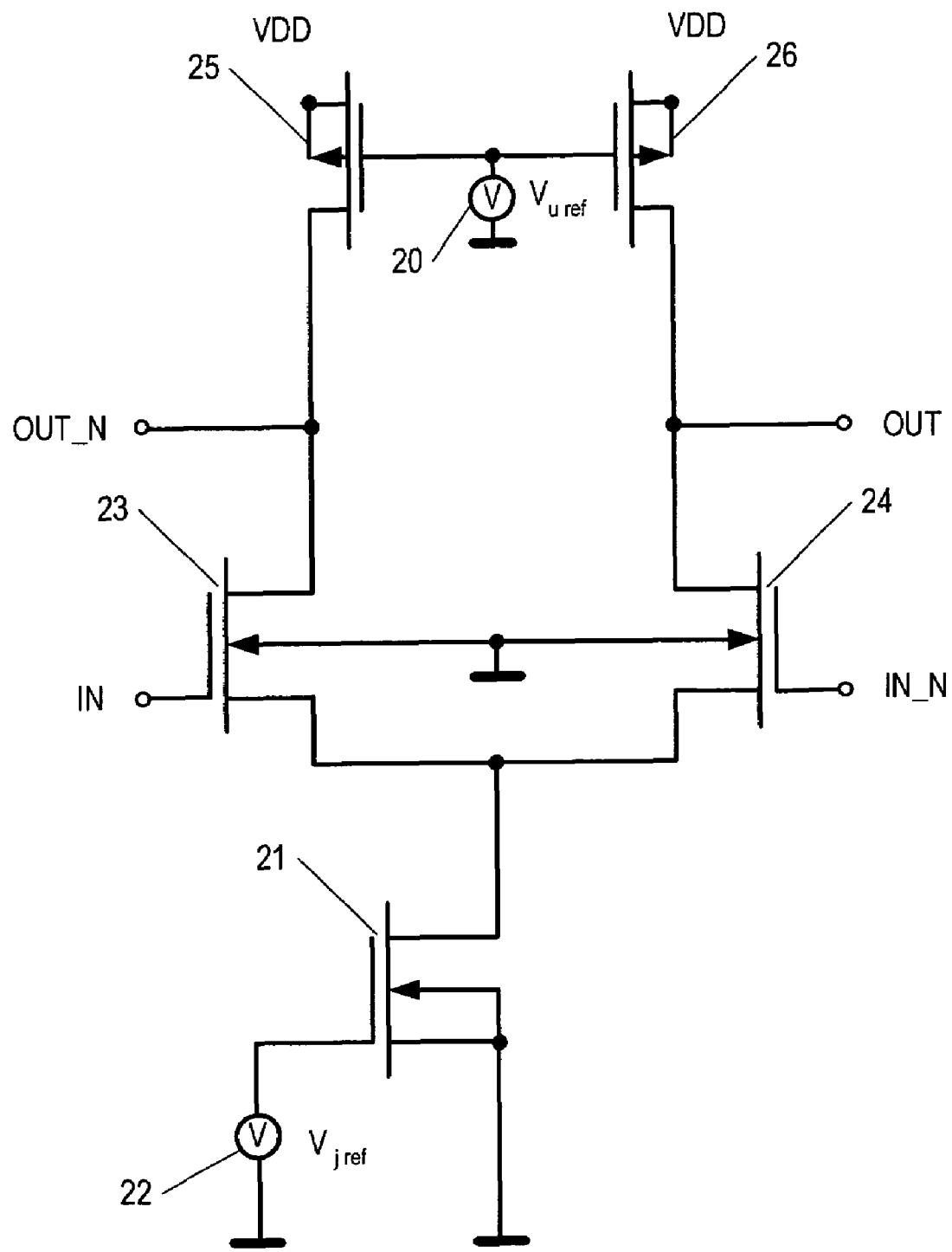
FIG. 2 shows a simple differential stage (i.e., gate) which can be used as an inverter or a non-inverting buffer, which are well known in the prior art.

In FIG. 2, a simple prior art differential stage (i.e., gate) is shown which can be used as an inverter or a non-inverting buffer depending on the connection polarity of the outputs to the next differential stage (i.e., gate). The key features of this differential stage (i.e., gate) is a current source 21, implemented in the simplest case using a transistor with a fixed voltage on the gate from a voltage source 22, the two transistors 23 and 24, forming the logic function of the inverter/buffer, with a pull up structure 25, 26 which can be in the simplest case two resistors. These differential gates are well known in the prior art and date back for many decades.

Consider now how the structure in FIG. 1 may be used for providing a reference voltage for the circuit shown in FIG. 2. It is appreciated that FIG. 2 is generic: one could use the same FIG. 1 with a single ended circuit comprising the left and middle portions of the circuit in FIG. 2, and with various other configurations thereof.

It shall be also appreciated that in this example embodiment, the first feedback signal, being represented by voltage reference 20 in FIG. 1 is used for the voltage reference 20 in FIG. 2, and the second feedback signal represented by voltage reference 22 in FIG. 1 is used as voltage reference, 22, in FIG. 2 to control the current. Alternatively, the voltage reference 20 in FIG. 1 can be used as voltage reference 22 in FIG. 22, while the voltage reference 22 from FIG. 1 will be fed in this case as voltage reference 20 in FIG. 2. It shall be taken into account that the feedback loops are negative type feedbacks, and accordingly, the polarity of feeding feedbacks shall be checked each time. In case the feedback is positive, an inverter stage (i.e., gate) is added to the feedback.

The gates 1, 2, 3 and 4 are all as described in FIG. 2 and the voltage references generated by the device in FIG. 1 can be applied to the gates in the ring oscillator 1, 2, 3, 4, as well as to the gates in the external circuitry for which it is desired to have a controlled propagation delay characteristic.

The operation of the circuit of the present invention will now be described in detail.

Where the process, temperature or Vdd causes the propagation time through the gates in the ring oscillator 1-4 to reduce, this is translated into a fall in the reference voltage 20. This in turn causes the pull up devices 25, 26 to reduce their strength, which causes an increase in the RC product of the pull up and parasitic capacitance of the circuitry. This then causes a drop in the frequency.

In turn, due to the higher resistance of the pull up 25, 26, the voltage on the voltage divider built using resistors 11 and 12, will go down, which will cause the output of the operational amplifier 10 to go down as well. This reduces the current in the logic gates 1-4 by reducing the voltage 22 on the gate of the current source in the differential gates. This is a closed loop, which will continue until the voltage Vj ref on the output of the divider will settle.

The time constant for the integrator is not critical, but depends on the requirements of the ring oscillator; whether it is to be used elsewhere as a clock source, then the time constant should be optimised to reduce jitter.

The cut off frequency of the low pass filter 6 is also not critical: the filter can be a high frequency just to reduce ripple and hunting of the loop.

Both the low pass filter 6 and the integrator 7, 8, 9, can be replaced by a typical charge pump circuit.

When the propagation delay of the gate becomes too big, then the circuit operates in the opposite way to that described above, to increase the pull up strength and increase the current, thus for a predefined propagation time the circuit will generate reference voltages that minimise the power consumption current and stablise the propagation time.

We claim:

1. A reference voltage generator for an external logic device, comprising:
   a ring oscillator circuit having a delay characteristic responsive to temperature, process, and/or power supply voltage variations, wherein the delay characteristic is related to a gate propagation characteristic of the external logic device;
   a reference clock generator;
   a first unit configured to detect a phase/frequency difference between a phase/frequency of the reference clock generator and a phase/frequency of the ring oscillator circuit, wherein the first unit is further configured to apply a first reference voltage to the external logic device, and wherein the first unit is configured to supply the first reference voltage to the plurality of logic gates of the ring oscillator circuit, and wherein the first reference voltage indicates the phase/frequency difference; and a second unit configured to measure a voltage swing of the ring oscillator circuit, wherein the second unit is further configured to apply a second reference voltage, independent of the phase/frequency of the ring oscillator circuit, to the external logic device and to supply the second reference voltage to the plurality of logic gates of the ring oscillator circuit, and wherein the second reference voltage is indicative of the measured voltage swing;

wherein the ring oscillator circuit is configured to respond to the first and second reference voltages by altering an output signal to settle the first and second reference voltages at a first level and a second level, respectively, to stabilize a propagation delay of the external logic device.

2. The reference voltage generator of claim 1, wherein the logic device comprises a single-ended circuit.

3. The reference voltage generator of claim 1, wherein the logic device comprises a differential circuit.

4. The reference voltage generator of claim 3, wherein the differential circuit comprises either a current mode buffer or a current mode inverter.

5. The reference voltage generator of claim 3, wherein the differential circuit comprises:
   a current source;
   a pair of transistors; and
   a pull-up device.

6. The reference voltage generator of claim 5, wherein the pull-up device is configured to vary a pull-up strength using either of the first or second reference voltages, and to vary a current of the current source using the remaining reference voltage.

7. The reference voltage generator of claim 1, wherein a respective logic gate is configured to reduce a current through the respective gate to a level needed to maintain a particular propagation delay through the respective logic gate.

8. The reference voltage generator of claim 1, wherein the first unit comprises a phase detector.

9. The reference voltage generator of claim 8, wherein the phase detector is integral with a phase-locked clock synthesizer.

10. The reference voltage generator of claim 5, wherein the pull-up device comprises an N-type MOSFET configured to accept at least one of the first reference voltage and the second reference voltages to reduce power consumption.

11. The reference voltage generator of claim 5, wherein the pull-up device comprises an N-type MOSFET configured to alter the propagation delay of a respective logic gate depending on application of either the first reference voltage or the second reference voltage.

12. A method of generating a reference voltage for an external logic device, comprising:
    detecting a phase/frequency difference between a phase/frequency of a reference clock generator and a phase/frequency of a ring oscillator circuit, wherein the ring oscillator circuit comprises delay behavior that is related to a gate propagation behavior of the external logic device, and wherein the delay behavior varies according to temperature, process, and/or power supply voltage variations;
    generating a first reference voltage based on the detected phase/frequency difference;
    applying the first reference voltage to the logic device and to the plurality of logic gates for the ring oscillator circuit;
    measuring a voltage swing of the ring oscillator circuit;
    generating a second reference voltage based on the measured voltage swing;
    applying the second reference voltage to a plurality of logic gates for the logic device and to the plurality of logic gates for the ring oscillator circuit;
    adjusting an output of the ring oscillator circuit in response to the first and second reference voltages such that the first and second reference voltages settle; and
    maintaining a constant propagation delay characteristic of the external logic device using either the first reference voltage or the second reference voltage.

13. The method of claim 12, further comprising:
    using at least one of the first reference voltage and the second reference voltages to vary a current of the external logic device.

14. The method of claim 12, further comprising:
    using at least one of the first reference voltage and the second reference voltages to vary a current of the logic device as a function of amplitude variations in the ring oscillator circuit.

15. The reference voltage generator of claim 1, wherein the second unit is independent of the first unit.

16. The reference voltage generator of claim 1, wherein each of the first and second reference voltages is a function of a gate propagation delay of a logic gate from the plurality of logic gates.

17. The method of claim 12, wherein each of the first and second reference voltages is a function of a gate propagation delay of a logic gate from the plurality of logic gates.

* * * * *

UNITED STATES PATENT AND TRADEMARK OFFICE
CERTIFICATE OF CORRECTION

PATENT NO. : 7,609,119 B2
APPLICATION NO. : 10/997592
DATED : October 27, 2009
INVENTOR(S) : Alexander Roger Deas It is certified that error appears in the above-identified patent and that said Letters Patent is hereby corrected as shown below:

Column 5, line 52, "reference voltages to reduce" should read --reference voltage to reduce--.
    Column 6, line 35, "reference voltages to reduce" should read --reference voltage to reduce--.
    Column 6, line 39, "reference voltages to reduce" should read --reference voltage to reduce--.

Signed and Sealed this

Fifth Day of January, 2010

David J. Kappos
*Director of the United States Patent and Trademark Office*